United States Patent
Oyer et al.

(10) Patent No.: US 10,615,305 B1
(45) Date of Patent: Apr. 7, 2020

(54) SELF-ALIGNMENT OF MICRO LIGHT EMITTING DIODE USING PLANARIZATION

(71) Applicant: Facebook Technologies, LLC, Menlo Park, CA (US)

(72) Inventors: Celine Claire Oyer, Cork (IE); Allan Pourchet, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/958,316

(22) Filed: Apr. 20, 2018

(51) Int. Cl.
*H01L 33/00* (2010.01)
*H01L 33/40* (2010.01)
*H01L 27/15* (2006.01)
*H01L 33/06* (2010.01)

(52) U.S. Cl.
CPC .......... *H01L 33/0075* (2013.01); *H01L 27/15* (2013.01); *H01L 33/06* (2013.01); *H01L 33/40* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| 2011/0229993 | A1* | 9/2011 | Hsieh | H01L 33/508 438/29 |
| 2011/0233586 | A1* | 9/2011 | Kojima | H01L 33/0079 257/98 |
| 2012/0217527 | A1* | 8/2012 | Ito | H01L 33/46 257/98 |
| 2014/0131729 | A1* | 5/2014 | Heo | H01L 33/62 257/76 |
| 2015/0076538 | A1* | 3/2015 | Lei | H01L 33/0079 257/96 |
| 2015/0155331 | A1* | 6/2015 | Guenard | H01L 27/153 257/93 |
| 2015/0171262 | A1* | 6/2015 | Kim | H01L 33/32 257/13 |
| 2015/0207042 | A1* | 7/2015 | Yoneda | H01L 24/00 257/98 |
| 2015/0263242 | A1* | 9/2015 | Tomizawa | H01L 33/44 257/98 |
| 2016/0043203 | A1* | 2/2016 | Alperstein | H01L 29/41708 257/51 |
| 2016/0223765 | A1* | 8/2016 | Krabe | G02B 6/426 |
| 2019/0013433 | A1* | 1/2019 | Kim | H01L 33/0041 |
| 2019/0103534 | A1* | 4/2019 | Sato | H01L 21/78 |
| 2019/0123033 | A1* | 4/2019 | Martin | H01L 33/32 |

* cited by examiner

*Primary Examiner* — Evren Seven
(74) *Attorney, Agent, or Firm* — Fenwick & West LLP

(57) ABSTRACT

Embodiments relate to a method for fabricating a light-emitting-diode (LED). A metal layer is deposited on a p-type semiconductor. The p-type semiconductor is on an n-type semiconductor. The metal layer is patterned to define a p-metal. The p-type semiconductor is etched using the p-metal as an etch mask. Similarly, the n-type semiconductor is etched using the p-metal and the p-type semiconductor as an etch mask to define individual LEDs.

17 Claims, 10 Drawing Sheets

SELF-ALIGNMENT OF MICRO LIGHT EMITTING DIODE USING PLANARIZATION

BACKGROUND OF THE INVENTION

1. Field of the Disclosure

The present disclosure relates to micro LED (µLED) fabrication and more specifically to µLED fabrication using self-alignment.

2. Description of the Related Art

Micro light-emitting diode (µLED) display are an emerging flat panel display technology that includes microscopic light-emitting diodes (LEDs) for displaying images. Compared to liquid crystal display (LCD) technology, µLED display devices offer improved contrast, faster response time, and lower energy consumption. However, as the size of µLEDs decreases, the alignment constraints for the µLEDs becomes more strict. Such strict alignment constraints increases the difficulty in fabricating the µLEDs.

SUMMARY

Embodiments relate to a micro light-emitting-diode (µLED) fabricated using a self-aligned process. To fabricate the µLED, a metal layer is deposited on a p-type semiconductor. The p-type semiconductor is on an n-type semiconductor. The metal layer is patterned to define a p-metal. The p-type semiconductor is etched using the p-metal as an etch mask. Similarly, the n-type semiconductor is etched using the p-metal and the p-type semiconductor as an etch mask to define individual micro LEDs.

In some embodiments, a planarization layer is deposited. The planarization layer is then etched to expose the patterned p-metal. As such, both the p-n junction and the contact hole for the p-metal are both self-aligned to the p-metal.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a process for fabricating micro light-emitting diodes (µLED). The fabrication process disclosed herein uses a self-aligned process to form p-electrodes on a p-doped semiconductor layer (e.g., Gallium Nitride) to form one or more µLEDs.

Figure 1:
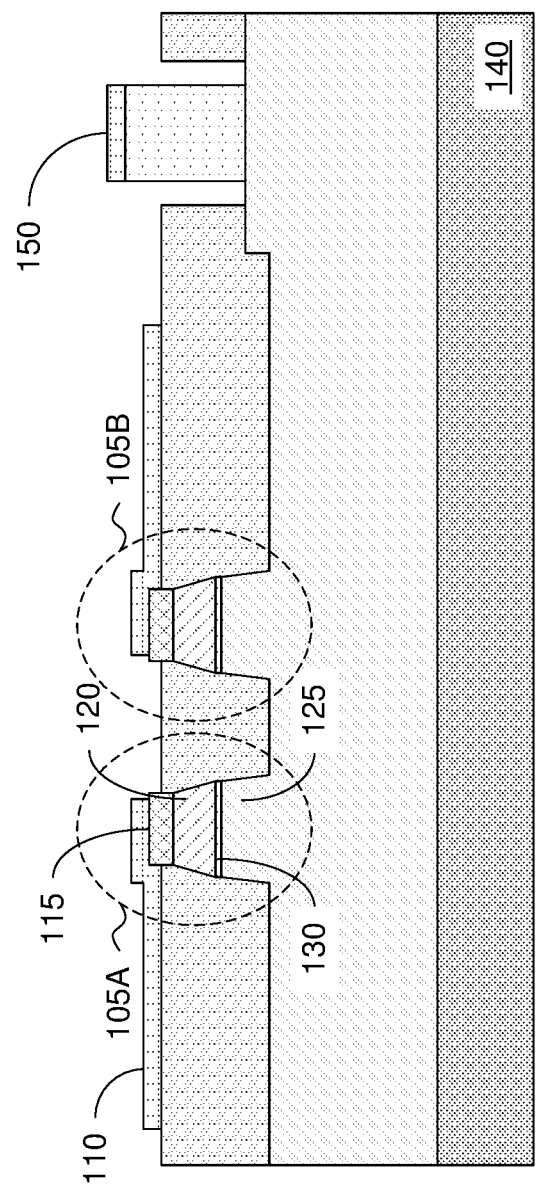
FIG. 1 illustrates a cross-sectional view of micro light-emitting diodes (µLED), according to one embodiment.

FIG. 1 illustrates a cross-sectional view of micro light-emitting diodes (µLED), according to one embodiment. FIG. 1 illustrates two µLEDs 105A, 105B (collectively referred to as "µLEDs 105" hereinafter) and an n-electrode 150. Each of the µLEDs 105 include a p-type layer 120, an n-type layer 125, and a quantum well (QW) 130. In some embodiments, the p-type layer and the n-type layer are doped gallium nitride (GaN) layers. In some embodiments, the GaN layers are grown on top of a transparent substrate 140. For instance, the transparent substrate may be a sapphire substrate or an indium tin oxide (ITO) substrate.

The µLEDs 105 further include a p-electrode 115 over the p-type layer 120 and a contact 110 for connecting to the p-electrode 115. In some embodiments, multiple µLEDs share a single n-electrode 150. For instance, the n-electrode may be coupled to ground or a negative supply voltage. Moreover, each µLED may have a separate p-electrode, such that each µLED may be independently controlled. Each of the LEDs 105 may include additional layers such as a barrier layer not illustrated in FIG. 1.

Figure 2:
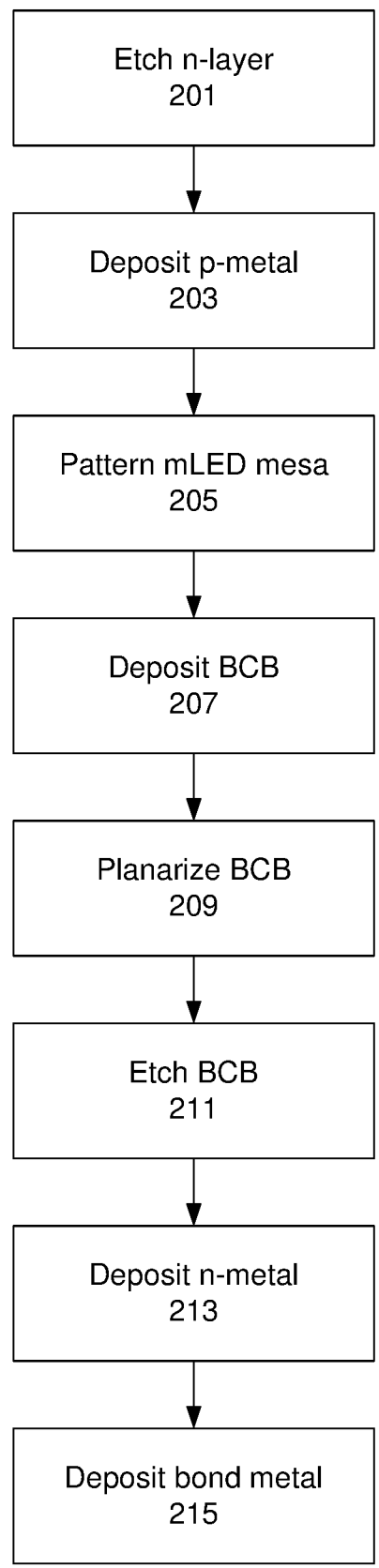
FIG. 2 illustrates a flowchart of a process for fabricating a µLED, according to one embodiment.
Figure 3A:
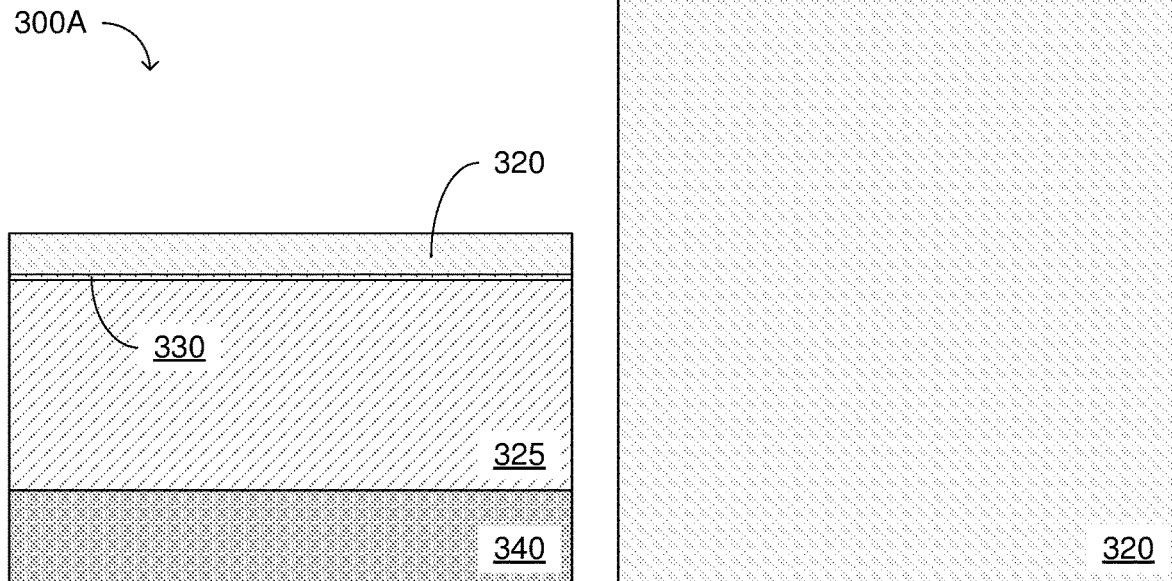
FIGS. 3A-3L illustrate cross-sectional views and top views of various fabrication steps of µLEDs, according to one embodiment.

FIG. 2 illustrates a flowchart of a process for fabricating an µLED, according to one embodiment. FIGS. 3A through 3L show cross-sectional views and top views of µLEDs at various steps of the process illustrated in FIG. 2. The self-aligned µLED fabrication process starts with a stack 300A including a substrate 340, an n-type layer 325 (e.g., n-type gallium nitride (N-GaN)), a quantum well (QW) 330, and a p-type layer 320 (e.g., p-type gallium nitride (P-GaN)). FIG. 3A illustrates the stack at the beginning of the flow shown in FIG. 2.

Figure 3B:
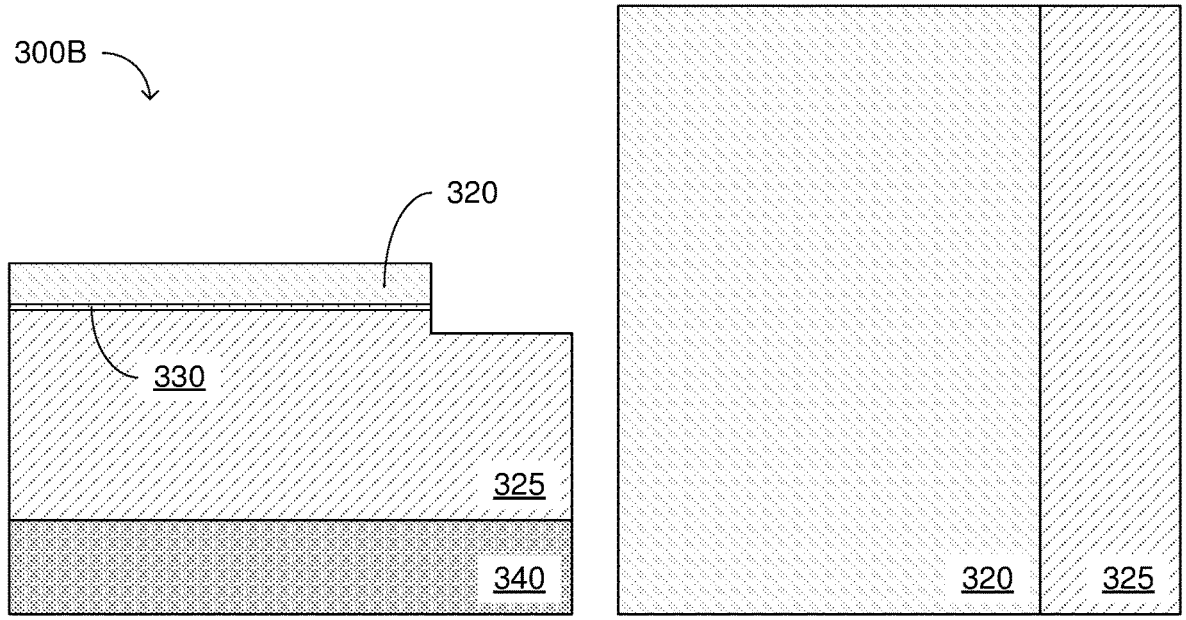

The stack 300A is etched 201 to expose the n-type layer 325, resulting in stack 300B illustrated in FIG. 3B. In some embodiments, the stack is etched using dry etching. In one embodiment, the dry etching is stopped approximately 300 nm below the QW 330.

In one embodiments, the amount of etching is controlled by using selective etching methods that has a selectivity in etching rate between the n-type layer 325, the p-type layer 320, and the QW 330. That is, an etching method that as an etching rate that is preferential to the p-type layer 320 is first used to etch the p-type layer 320 until the p-type layer is completely etched. Depending on the selectivity of the etching method, the etching method for etching the p-type layer is performed for an amount of time longer than what is expected for completely etching the height of the p-type layer without the risk of a substantial etch in the n-type layer 320.

In other embodiments, if the etching method is not selective between the p-type layer 320 and the n-type layer 325, the amount of etching is controlled by calculating the time to etch the height of the p-type layer 320 and a predetermined height (e.g., 300 nm) of the n-type layer 325. The time is calculated based on an etching rate for the p-type layer and the n-type layer of the etching method being used.

Figure 3C:
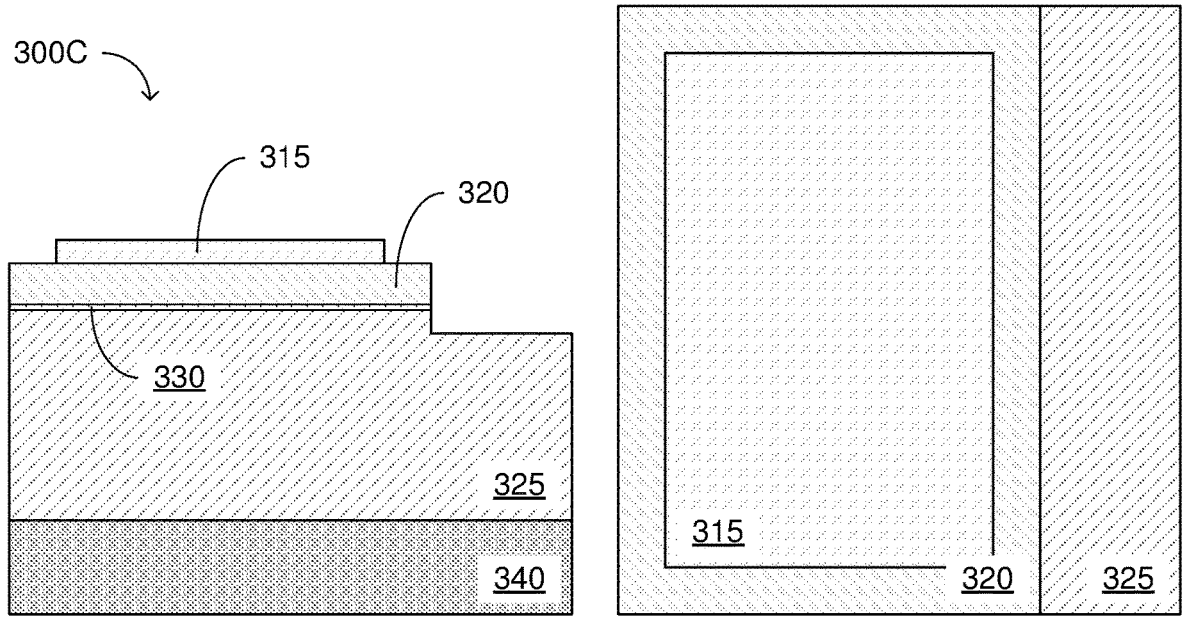
Figure 3D:
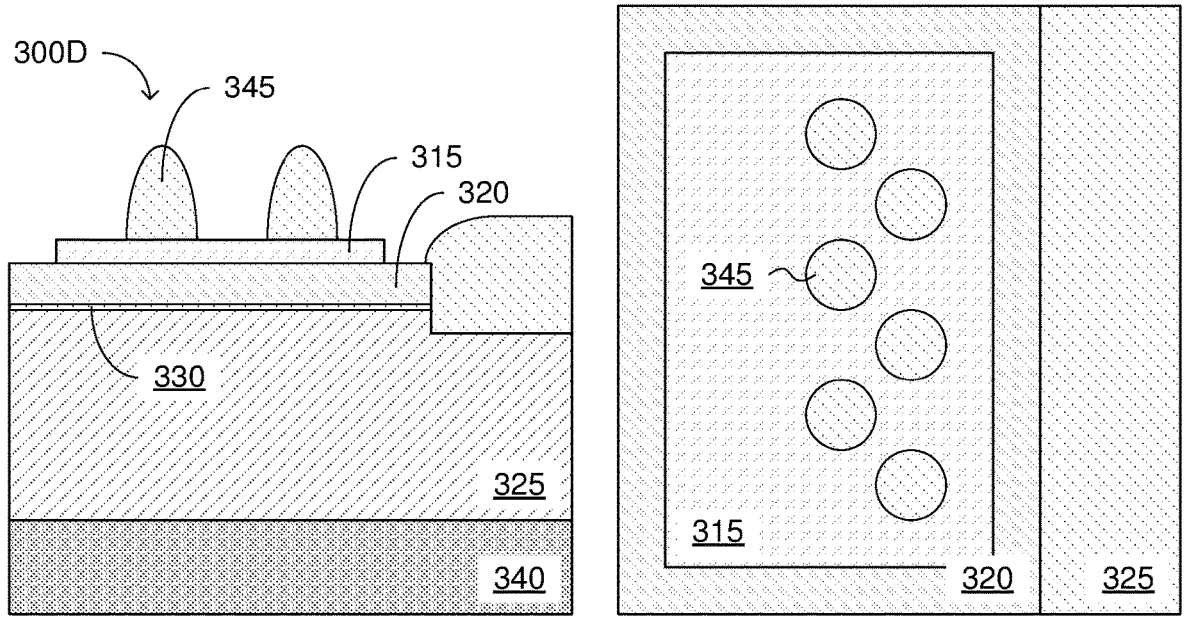
Figure 3E:
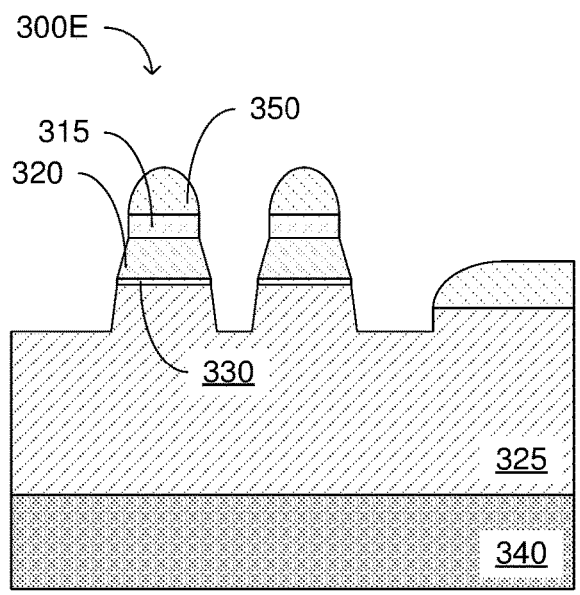
Figure 3E:
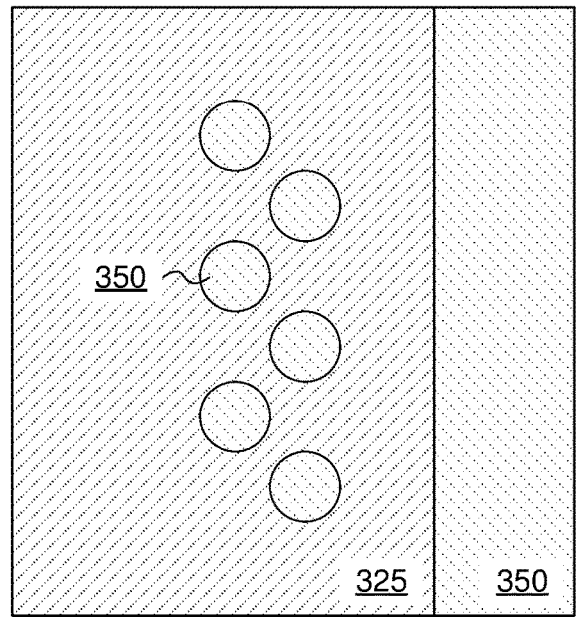

P-metal 315 is deposited 203 on the p-type layer 320 resulting stack 300C illustrated in FIG. 3C. The p-metal 315 may be made of nickel gold (NiAu) or other similar metal.

In some embodiments, an adhesion layer is deposited before depositing the p-metal to aid the adhesion of the p-metal 315 and the p-type layer 320.

The stack 300C is patterned 205 to form the μLED mesa structures. To pattern the μLED mesa structures, photoresist 345 is applied and patterned to form the stack 300D illustrated in FIG. 3D. The stack 300D is then etched to form the structure illustrated in FIG. 3E. In some embodiments, the p-metal is wet etched to form an undercut. Furthermore, the p-type layer 320, QW 330, and the n-type layer 325 may be dry etched to achieve a desired profile. After then μLED mesas have been etched, the photoresist 345 is removed as shown in FIG. 3F.

Figure 3F:
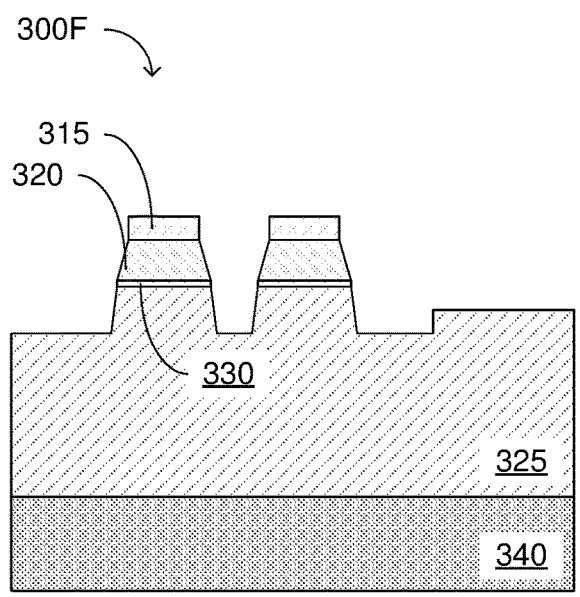
Figure 3F:
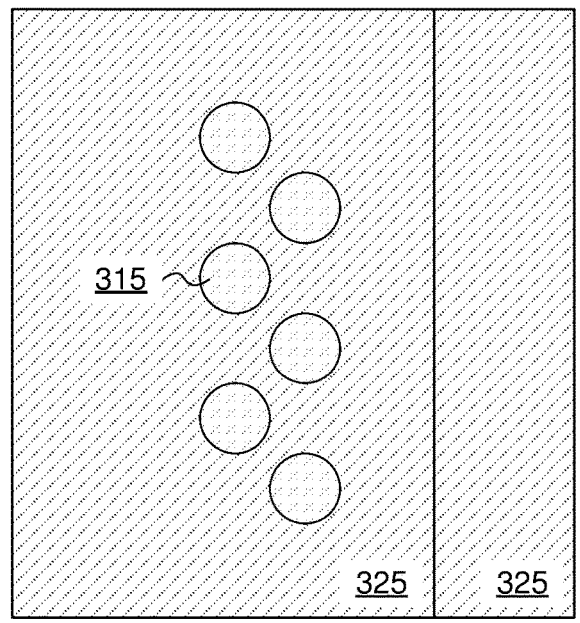

As a result, the p-metal is self-aligned onto the μLED mesa as illustrated in FIG. 3F. Because the p-metal is formed on the μLED mesa through a self-aligned process, a separate alignment step for aligning the p-metal to the μLED mesa can be removed, and the alignment between the p-metal and the μLED mesa is improved. By having the p-metal to be self-aligned to the μLED mesa, the fabrication of the μLEDs with higher misalignment tolerances is enabled and obviates the use of expensive alignment steps.

Figure 3G:
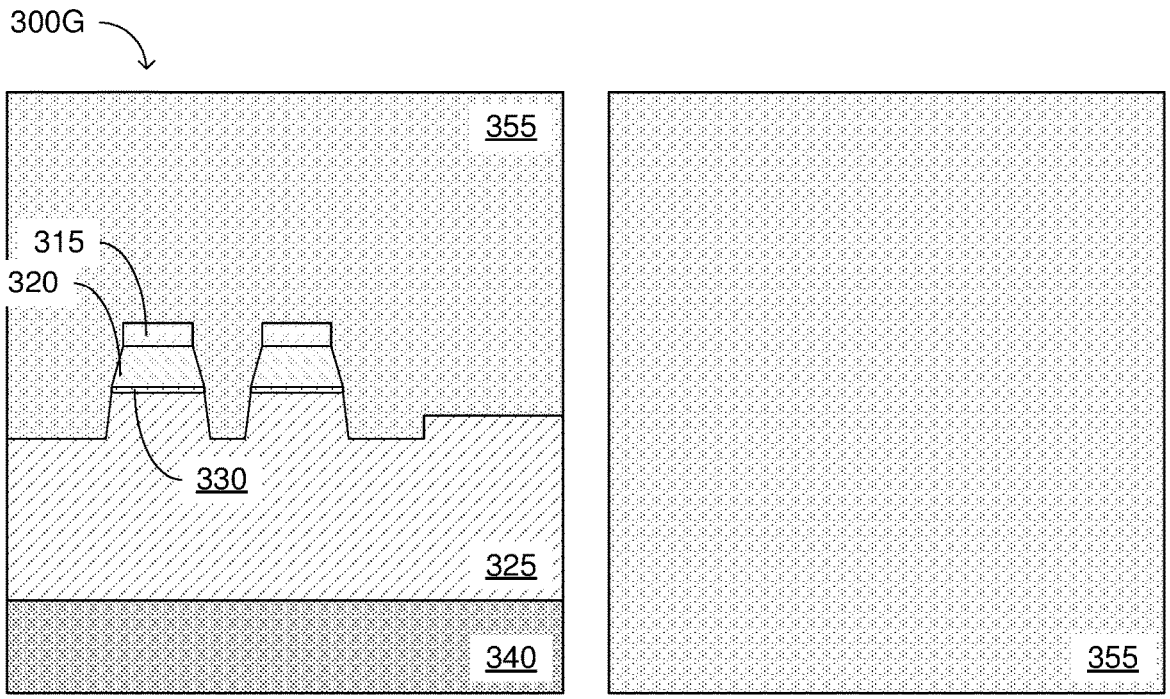
Figure 3H:
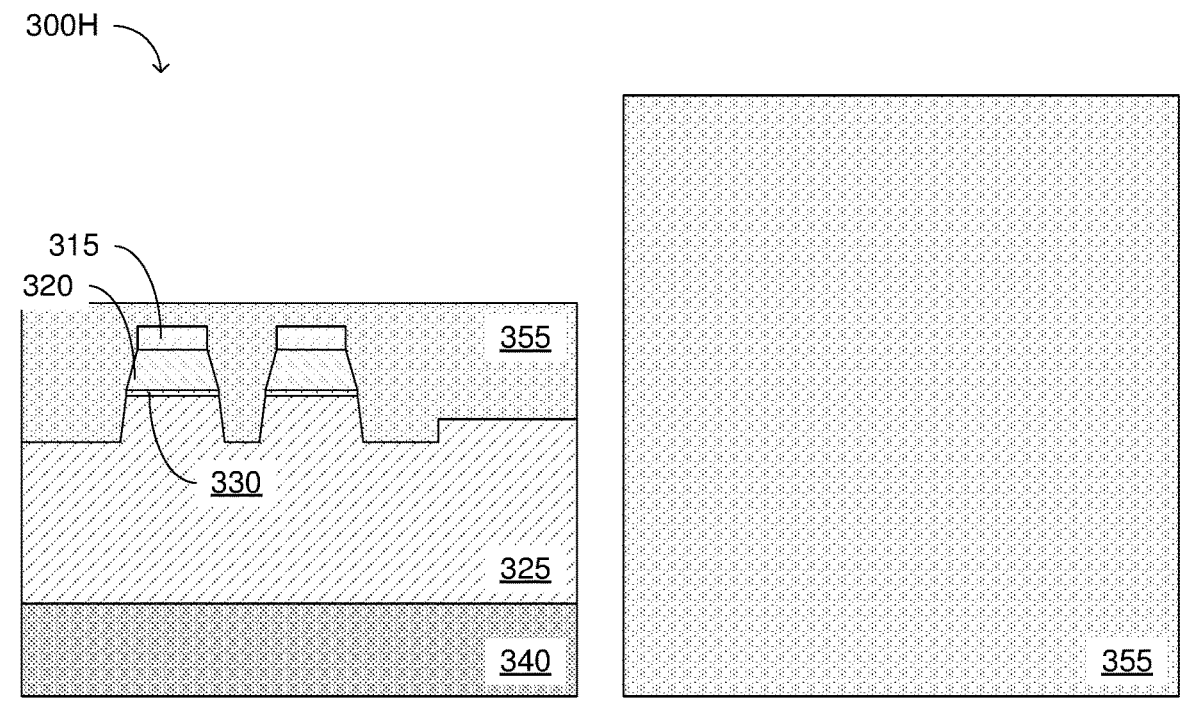
Figure 3I:
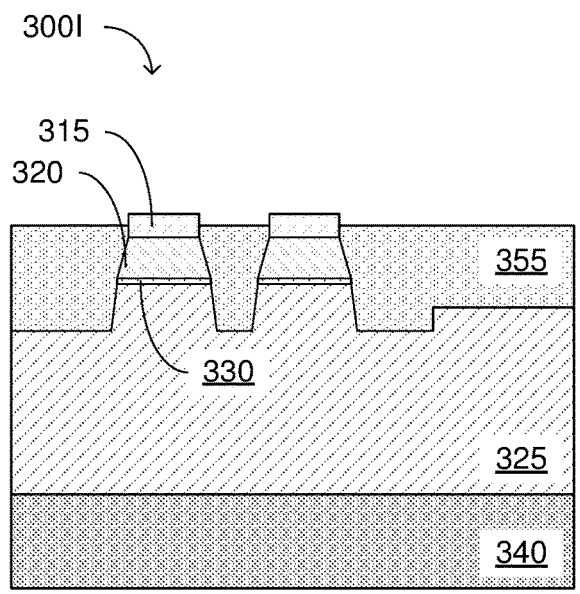
Figure 3I:
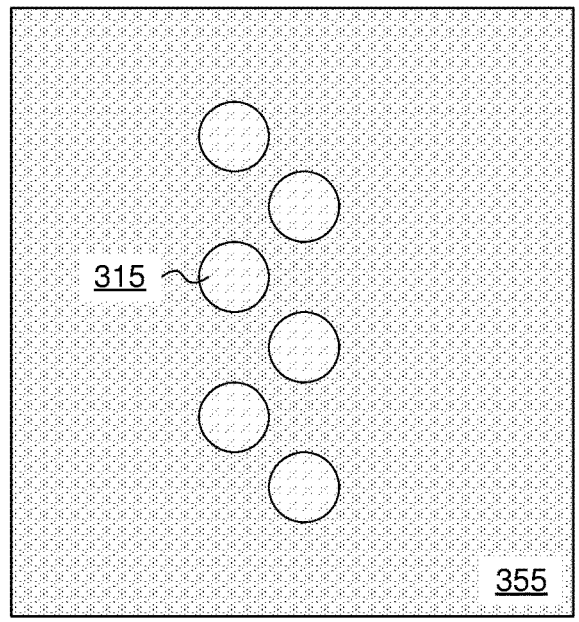
Figure 3J:
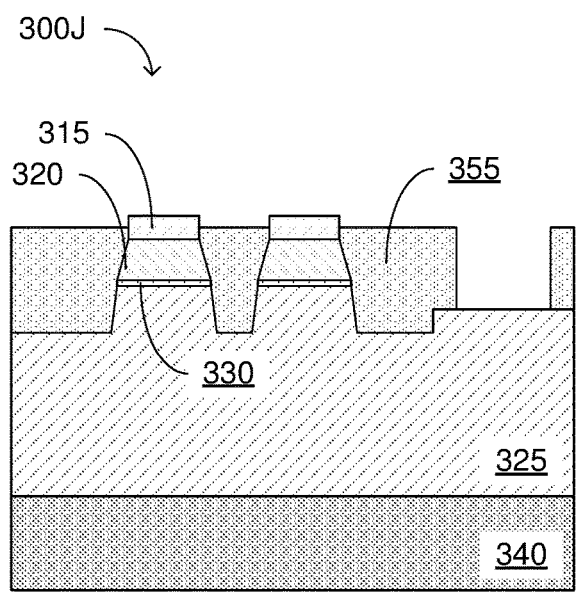
Figure 3J:
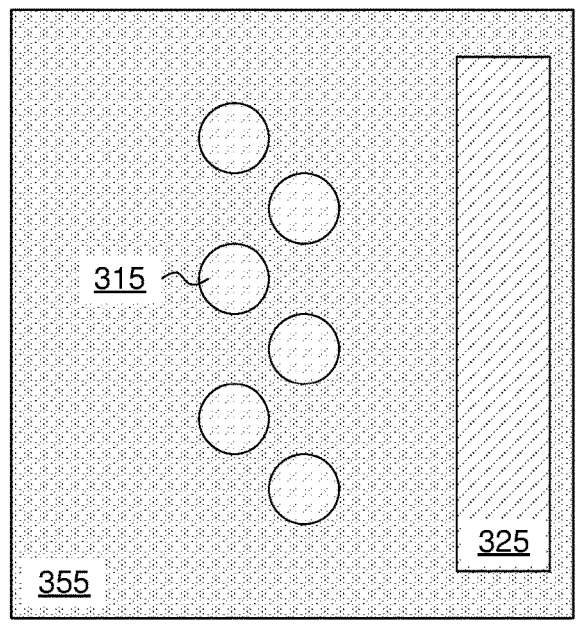

As shown in FIG. 3G, a layer of an insulation layer 355 such as a polymer including benzocyclobutene (BCB) is deposited 207. For example, a polymer may be spin coated onto the substrate and subsequently cured. In other embodiments, other polymers may be used instead of BCB. In yet other embodiments, nitrides or oxides are used instead of polymers for the insulation layer 355. In some embodiments, the insulation layer 355 is also used as a planarization layer. In some embodiments, the insulation layer 355 is used to isolate the μLEDs. In some embodiments, other insulators such as oxides or nitrides is deposited as the insulation layer 355. Then, as shown in FIG. 3H, the insulation layer 355 is planarized 209 and thinned down using chemical-mechanical polishing (CMP) process. Subsequently, as shown in FIG. 3I, the insulation layer 355 is etched 211 using dry etching to expose the p-metal 315. In some embodiments, the insulation layer 355 is etched using end-point detection, where interferometry, reflectometry, and/or spectrometry is used to determine a thickness of a layer, or whether a specific material is exposed to determine an end point of an etching step. That is, in some embodiments, the thickness of the insulation layer is periodically measured to determine whether the etching of the insulation layer 355 is complete. In other embodiments, a determination is made whether the p-metal is exposed to determine whether the etching of the insulation layer 355 is complete.

In some embodiments, the insulation etching is stopped after the p-metal layer has been exposed and before the p-type layer is exposed. As such, metal layer may be deposited on top of the p-metal and the insulation layer to route the p-metal to other locations. In some embodiments, the p-metal is routed to contact pads to allow an electrical connection to be made with the p-metal. In this embodiment, the thickness of the p-metal may be chosen based on the accuracy of end-point detection method used to etch the insulation layer 355. For instance, the thickness of the p-metal is chosen to be larger than the margin of error of the end-point detection method used.

As such, the exposure of the p-metal is self-aligned to the p-metal 315 itself. That is, the p-metal can be completely exposed without exposing the layers underneath the p-metal without using an alignment step. This relaxes the constraint for an accurate alignment method and allows fabrication of μLEDs with smaller feature sizes and pitch sizes. That is, the opening of the p-metal 315 is achieved without an additional alignment step. By having the opening of the p-metal to be self-aligned, the fabrication of the μLEDs with higher misalignment tolerances can be enabled and obviates the use of expensive alignment steps.

Figure 3K:
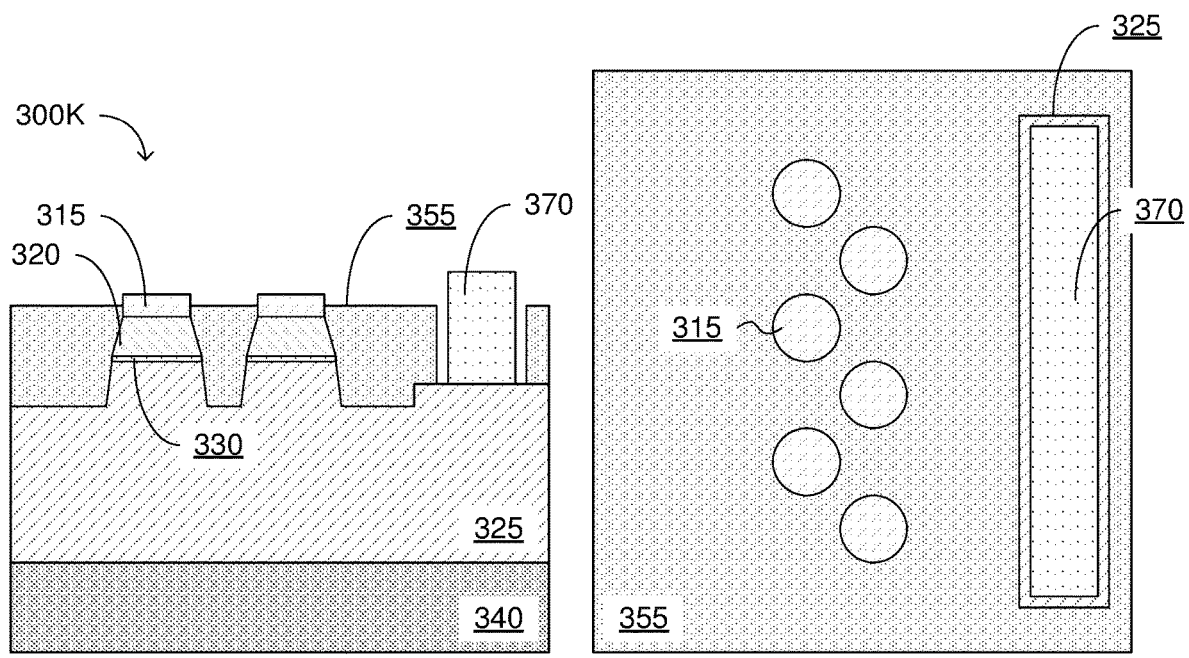
Figure 3L:
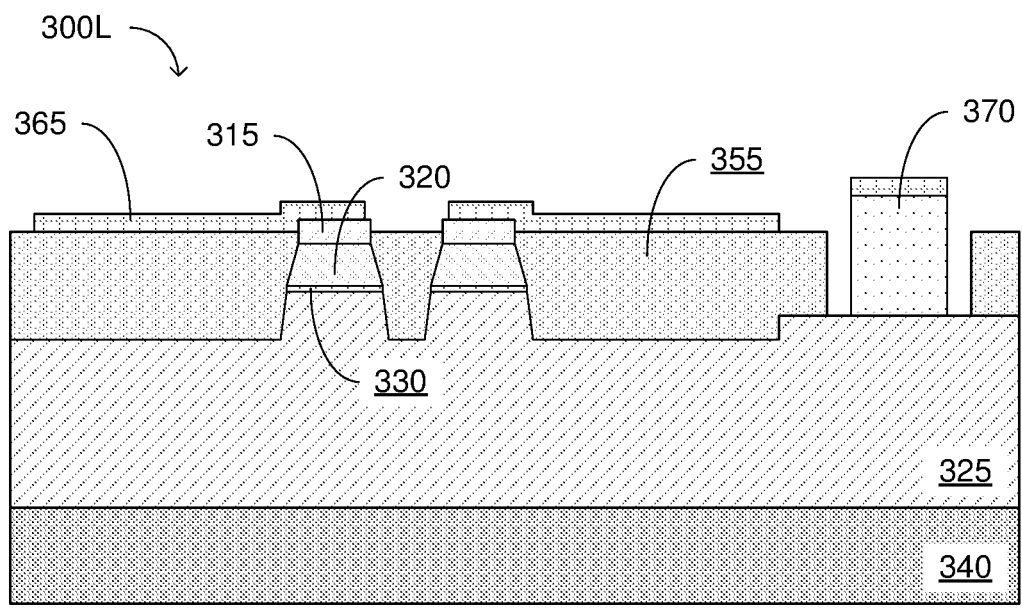
Figure 3L:
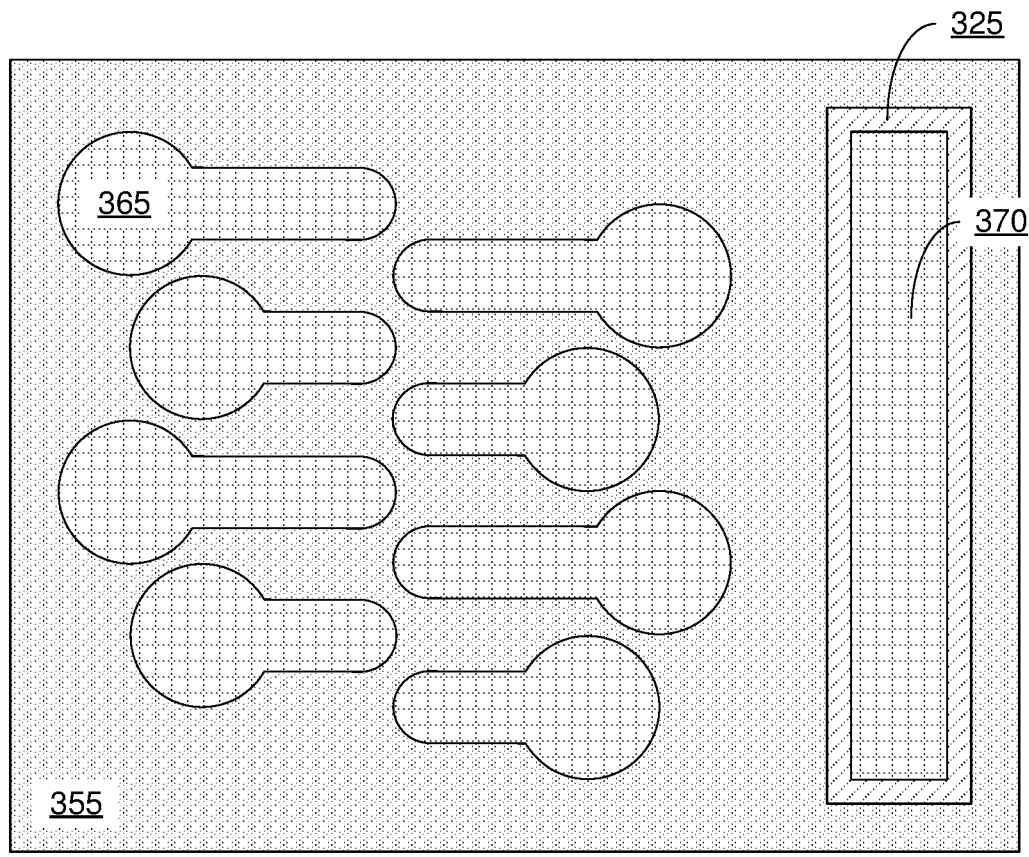

N-metal 370 is deposited 213. In some embodiments, as show in FIG. 3J, the region where the n-metal 370 is to be located is etched to expose the n-type layer 325 before depositing the n-metal 370. Furthermore, as shown in FIG. 3K, after depositing a metal layer for forming the n-metal 370, the deposited metal layer may be patterned.

Bond metal 365 is deposited 215. In some embodiments, the bond metal is deposited on top of the p-metal 315 and on top of the n-metal 370. In some embodiments, the bond metal is a titanium-gold (TiAu) alloy. In some embodiments, the bond metal 365 is patterned form bond pads and track lines connecting the bond pads to the p-metal. In some embodiments, additional layers, such as a passivation layer and a seed metal layer is deposited on top of the stack 300L of FIG. 3L.

As such, the two alignment steps for aligning the p-metal 115 to the p-layer 120, and for exposing the p-metal are eliminated. Thus, the disclosed process allows the fabrication of a μLED without any alignment steps, reducing the complexity of the fabrication process.

Figure 4:
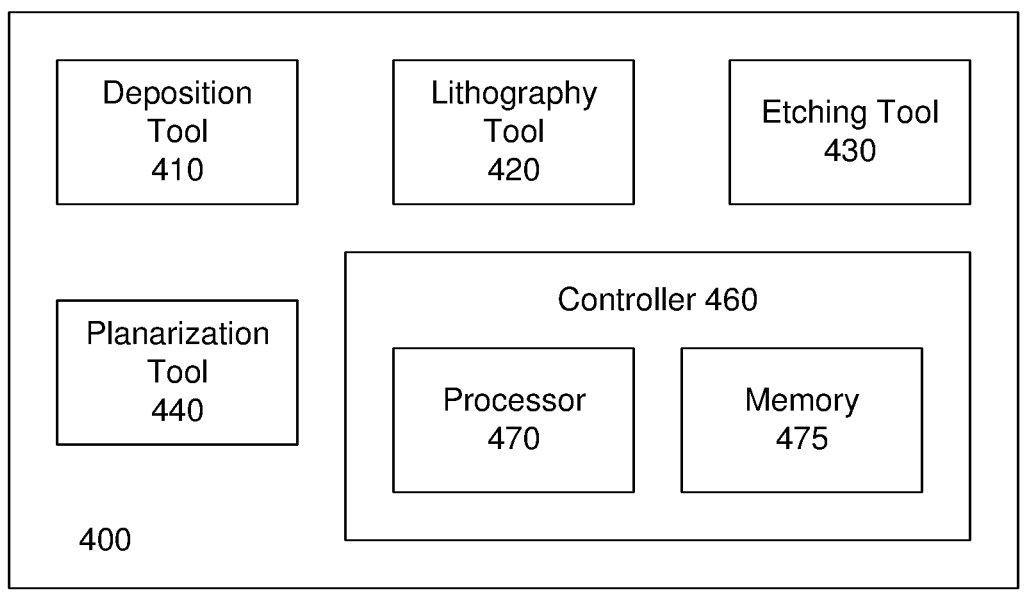
FIG. 4 illustrates a block diagram of a device for manufacturing the µLEDs.

FIG. 4 illustrates a block diagram of a device 400 for manufacturing the μLEDs. The device 400 includes a deposition tool 410, a lithography tool 420, an etching tool 430, a planarization tool, and a controller 460.

The deposition tool 410 deposits layers of material onto a substrate. The deposition tool 410 may use techniques such as molecular beam epitaxy (MBE) or chemical vapor deposition (CVD) to deposit or grow layers of material onto a substrate.

The lithography tool 420 transfers geometric patterns from a photomask to a light-sensitive chemical photoresist. The lithography tool 420 may include tools to deposit or spin coat photoresist onto a substrate, align the photomask to the substrate, expose the photoresist, and develop the photoresist. In some embodiments, the lithography tool further includes tools to remove the photoresist from the substrate.

The etching tool 430 chemically or physically removes layers from the surface of a substrate. The etching tool 430 may include tools for performing wet etching and/or dry etching. The etching tool 430 may be configured to follow pre-determined recipes based on the type of material being etched. In some embodiments, the etching tool 430 includes an end-point detection functionality that periodically or continuously determines the thickness of the layer being etched, or whether a certain layer has been exposed to determine the end-point of the etching process.

The planarization tool 440 smooths or planarizes the surface of a substrate using chemical and/or mechanical forces. The planarization tool 440 uses an abrasive chemical slurry and a polishing pad to planarize the surface of the substrate.

The controller 460 controls the fabrication process of the μLEDs. The controller 460 includes a processor 470 and a memory 475. The memory 475 stores the sequence of steps and the recipes to be followed for fabricating the μLEDs. For instance, the memory 475 stores the steps illustrated in the flowchart of FIG. 2. The processor retrieves the steps stored in memory 475 and instructs each of the tools 410, 420, and 430 to perform the steps for fabricating the μLEDs.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A method of fabricating a light emitting diode (LED) device, comprising:
   depositing a metal layer directly on a p-type semiconductor, the p-type semiconductor disposed on an n-type semiconductor;
   patterning the metal layer to define a p-metal;
   etching the p-type semiconductor, the etching of the p-type semiconductor aligned to the patterned p-metal;
   etching the n-type semiconductor to define individual LEDs of the LED device, the etching of the n-type semiconductor aligned to the etched p-type semiconductor;
   depositing a planarization layer over the defined individual LEDs; and
   etching the planarization layer to expose the patterned p-metal, wherein the planarization layer and the p-type semiconductor are both self-aligned to the p-metal.

2. The method of claim 1, wherein the planarization layer is a polymer including Benzocyclobutene.

3. The method of claim 1, wherein dry-etching the planarization layer comprises stopping the dry-etching process when a thickness of the planarization layer is equal to or lower than a preset thickness.

4. The method of claim 1, wherein dry-etching the planarization layer comprises stopping the dry-etching process responsive to determining that the patterned p-metal is exposed.

5. The method of claim 4, wherein the determination of whether the patterned p-metal is exposed is performed with an interferometer, a reflectometer, or a spectrometer.

6. The method of claim 4, wherein a thickness of the metal layer is larger than a margin of error of a tool used to determine whether the patterned p-metal is exposed.

7. The method of claim 1, wherein the dry-etching is stopped before the p-type semiconductor is exposed.

8. The method of claim 1, further comprising:
   depositing a bond metal over the etched planarization layer and the exposed p-metal, wherein the bond metal is in contact with the exposed p-metal.

9. A light-emitting-diode (LED) fabricated by a process comprising the steps of:
   depositing a metal layer directly on a p-type semiconductor, the p-type semiconductor disposed on an n-type semiconductor;
   patterning the metal layer to define a p-metal;
   etching the p-type semiconductor, the etching of the p-type semiconductor aligned to the patterned p-metal;
   etching the n-type semiconductor to define individual LEDs of the LED device, the etching of the n-type semiconductor aligned to the etched p-type semiconductor;
   depositing a planarization layer over the defined individual LEDs; and
   etching the planarization layer to expose the patterned p-metal, wherein the planarization layer and the p-type semiconductor are both self-aligned to the p-metal.

10. The LED of claim 9, wherein the planarization layer is a polymer including Benzocyclobutene.

11. The LED of claim 9, wherein dry-etching the planarization layer comprises stopping the dry-etching process when a thickness of the planarization layer is equal to or lower than a preset thickness.

12. The LED of claim 9, wherein dry-etching the planarization layer comprises stopping the dry-etching process responsive to determining that the patterned p-metal is exposed.

13. The LED of claim 12, wherein the determination of whether the patterned p-metal is exposed is performed with an interferometer, a reflectometer, or a spectrometer.

14. The LED of claim 12, wherein a thickness of the metal layer is larger than a margin of error of a tool used to determine whether the patterned p-metal is exposed.

15. The LED of claim 9, wherein the dry-etching is stopped before the p-type semiconductor is exposed.

16. The LED of claim 9, further fabricated by a process comprising the steps of:
   depositing a bond metal over the etched planarization and the exposed p-metal, wherein the bond metal is in contact with the exposed p-metal.

17. A non-transitory computer readable storage medium configured to store instructions, the instructions, when executed by a fabrication tool, cause the fabrication tool to:
   deposit a metal layer directly on a p-type semiconductor, the p-type semiconductor disposed on an n-type semiconductor;
   pattern the metal layer to define a p-metal;
   etch the p-type semiconductor, the etching of the p-type semiconductor aligned to the patterned p-metal;
   etch the n-type semiconductor to define individual LEDs of the LED device, the etching of the n-type semiconductor aligned to the etched p-type semiconductor;
   depositing a planarization layer over the defined individual LEDs; and
   etching the planarization layer to expose the patterned p-metal, wherein the planarization layer and the p-type semiconductor are both self-aligned to the p-metal.

* * * * *